United States Patent [19]
Yee et al.

[11] Patent Number: 5,463,332
[45] Date of Patent: Oct. 31, 1995

[54] MULTIPLE DIFFERENTIAL INPUT ECL OR/NOR GATE

[75] Inventors: Loren W. Yee, San Francisco; Nguyen X. Sinh, San Jose, both of Calif.

[73] Assignee: National Semiconductor Corporation, Santa Clara, Calif.

[21] Appl. No.: 279,035

[22] Filed: Jul. 22, 1994

[51] Int. Cl.⁶ .................................................. H03K 19/20
[52] U.S. Cl. .......................................... 326/126; 326/124
[58] Field of Search .................................. 326/126, 202; 327/2

[56] References Cited

U.S. PATENT DOCUMENTS

| | | | |
|---|---|---|---|
| 4,410,816 | 10/1983 | Kanai | 307/455 |
| 4,877,977 | 10/1989 | Kokado | 307/455 |
| 5,099,142 | 3/1992 | Barre | 307/272.2 |
| 5,126,597 | 6/1992 | Usami | 307/454 |
| 5,331,225 | 7/1994 | Matsui | 307/446 |
| 5,347,175 | 9/1994 | Laug | 307/455 |

*Primary Examiner*—Edward P. Westin
*Assistant Examiner*—Andrew Sanders
*Attorney, Agent, or Firm*—Skjerven, Morrill, MacPherson, Franklin & Friel; Paul J. Winters; Patrick T. Bever

[57] ABSTRACT

An ECL circuit including first and second transistors driven by differential input signals. Both transistors include emitters connected to a common node. The first transistor has a first collector connected to a first output terminal and a first base connected to receive a first biasing signal. The second transistor has a second collector connected to a second output terminal and a second base connected to receive a second biasing signal. The first and second biasing signals driving the first and second transistors are logical complements.

12 Claims, 3 Drawing Sheets

MULTIPLE DIFFERENTIAL INPUT ECL OR/NOR GATE

BACKGROUND OF THE INVENTION

1. Field of the Invention

The present invention is related to emitter coupled logic (ECL) circuits and more particularly to ECL circuits exhibiting low power dissipation.

2. Description of the Prior Art

Emitter-coupled logic (ECL) is distinguished from other logic families in that the transistors of an ECL circuit do not saturate during switching operations. As a result, the transistors produce lower propagation delays, and ECL circuits are therefore typically much faster than other logic families. However, the power dissipation and noise immunity of ECL circuits-is the worst of all available logic families. Therefore, ECL circuits are typically used only in special high-speed applications, such as in telecommunication circuitry.

FIG. 1 shows a prior art single level ECL switch 100. ECL switch 100 includes transistor $Q_{11}$ having a base connected to ECL input terminal 101, and a transistor $Q_{12}$ having a base connected to a reference voltage $V_{REF}$. The emitters of transistors $Q_{11}$ and $Q_{12}$ are commonly connected to a node $N_{11}$, which in turn is connected to a supply voltage $V_{EE}$ (typically −4.5 to −5.2 V) through a current source 102. The collectors of transistors $Q_{11}$ and $Q_{12}$ are connected to ground through resistors $R_{11}$ and $R_{12}$, respectively. The collector of transistor $Q_{12}$ is also connected to the base of transistor $Q_{13}$, whose collector is connected to ground and whose emitter is connected to $V_{EE}$ through resistor $R_{13}$. The emitter of transistor $Q_{13}$ is also connected to an ECL output terminal 103.

In operation, low input voltages of −1.4 to −1.8 V and high input voltages of −0.8 V are applied to input terminal 101, while $V_{REF}$ is maintained at −1.1 to −1.3 V. The output signal at output terminal 103 changes in response to the input voltage at input terminal 101. For example, a low input voltage signal applied to input terminal 101 turns off $Q_{11}$, thereby turning on $Q_{12}$ and causing all of the current drawn by current source 102 to pass through resistor $R_{12}$. The resulting voltage drop across resistor $R_{12}$ causes the voltage level at the output terminal 103 to lower by an approximately equal amount, thereby providing a low ECL output state.

Conversely, a high input voltage signal applied to input terminal 101 turns on $Q_{11}$ and turns off $Q_{12}$, thereby causing all current to pass through resistor $R_{11}$. Because a zero voltage drop exists across resistor $R_{12}$, 0 V (ground) is applied to the base of transistor $Q_{13}$, and the resulting voltage level at output terminal 103 is a diode drop below ground, thereby providing a high ECL output state.

It is noted that the voltage swing at the input terminal is between 600 mV (the difference between a low input voltage of −1.4 V and a high input voltage of −0.8 V) and 1 V (the difference between a low input voltage of −1.8 V and a high input voltage of −0.8 V).

FIG. 2 shows a multiple input ECL OR/NOR gate 200. As with the ECL switch 100 (described above), ECL OR/NOR gate 200 is a single level circuit. ECL OR/NOR gate 200 includes transistors $Q_{211}$, $Q_{212}$ ... $Q_{21n}$ having bases connected to input terminals 201(1), 201(2) ... 201(n), and a transistor $Q_{22}$ having a base connected to reference voltage $V_{REF}$. The emitters of transistors $Q_{211}$ ... $Q_{21n}$ and $Q_{22}$ are commonly connected to a node $N_{21}$, which in turn is to a supply voltage $V_{EE}$ through a current source 202. The collectors of transistors $Q_{211}$ ... $Q_{21n}$ and $Q_{22}$ are connected to ground through resistors $R_{21}$ and $R_{22}$, respectively. The collectors of transistors $Q_{211}$ ... $Q_{21n}$ are also connected to the base of transistor $Q_{23}$, whose collector is connected to ground and Whose emitter is connected to $V_{EE}$ through resistor $R_{23}$. The emitter of transistor $Q_{23}$ forms a NOR output terminal 203. The collector of transistor $Q_{22}$ is connected to the base of transistor $Q_{24}$, whose collector is connected to ground and whose emitter is connected to $V_{EE}$ through resistor $R_{24}$. The emitter of transistor $Q_{24}$ forms an OR output terminal 204.

In operation, if any of the input terminals 201(1), 201(2) ... 201(n) are high, its corresponding transistor $Q_{211}$ ... $Q_{21n}$ is turned on and $Q_{22}$ is turned off. This causes all of the current drawn by current source 202 to pass through resistor $R_{21}$. The resulting voltage drop across resistor $R_{21}$ is applied to the base of transistor $Q_{23}$, thereby providing a low ECL output state at the NOR output terminal 203. At the same time, with transistor $Q_{22}$ turned off, little or no current passes through resistor $R_{22}$. Therefore, a high voltage is present at the base of transistor $Q_{24}$, which creates a high ECL output state at the OR output terminal 204.

Conversely, low signals on all of the input terminals 201(1), 201(2) ... 201(n) turns off corresponding transistors $Q_{211}$ ... $Q_{21n}$ and turns on transistor $Q_{22}$, thereby causing all current to pass through resistor $R_{22}$. The resulting voltage drop across resistor $R_{22}$ causes a low ECL output state at output terminal 204. At the same time, with transistors $Q_{211}$ ... $Q_{21n}$ turned off, a high voltage is applied to the base of transistor $Q_{23}$, thereby causing a high ECL output state at the NOR output terminal 203.

FIG. 3 shows a prior art multilevel ECL gate 300. Multilevel ECL logic is used to produce logic gates, such as AND and NAND gates, and other logic circuits which cannot be produced using the single level ECL logic described above. Referring to FIG. 3, the ECL gate 300 includes transistor $Q_{31}$ having a base connected to first input terminal 301(1) and a transistor $Q_{32}$ having a base connected to a reference voltage $V_{REF1}$. The emitters of transistors $Q_{31}$ and $Q_{32}$ are commonly connected to a node $N_{31}$. The collectors of transistors $Q_{31}$ and $Q_{32}$ are connected to ground through resistors $R_{31}$ and $R_{32}$, respectively. The collector of transistor $Q_{32}$ is also connected to the base of transistor $Q_{33}$, whose collector is connected to ground and whose emitter is connected to $V_{EE}$ through resistor $R_{33}$. The emitter of transistor $Q_{33}$ forms an output terminal 303. ECL gate 300 differs from the single level ECL switch 100 in that the common emitter node $N_{31}$ and the collector of transistor $Q_{32}$ are connected to the collectors of transistors $Q_{34}$ and $Q_{35}$, respectively, which form a second differential pair having emitters connected to $V_{EE}$ through current source 302(1). The base of transistor $Q_{34}$ is connected to the emitter of a transistor $Q_{36}$ and to $V_{EE}$ through a second current source 302(2). The collector of transistor $Q_{36}$ is connected to ground. A second input terminal 301(2) of the ECL gate 300 is connected to the base of transistor $Q_{36}$. Finally, the base of transistor $Q_{35}$ is connected to a second reference voltage $V_{REF2}$.

In operation, high input voltage signals applied to both input terminals 301(1) and 301(2) turns on $Q_{31}$ and $Q_{34}$, and transistors $Q_{32}$ and $Q_{35}$ are turned off. This causes all of the current drawn by current source 302(1) to pass through transistor $Q_{34}$, $Q_{31}$ and resistor $R_{31}$. The resulting zero voltage drop across resistor $R_{32}$ causes a high ECL output state at output terminal 303.

Conversely, when a low input voltage is applied to one or more of the input terminal 301(1) and 301(2), at least one of transistors $Q_{31}$ and $Q_{34}$ remains off and at least one of the corresponding transistors $Q_{32}$ and $Q_{35}$ is turned on, thereby causing current to pass through resistor $R_{32}$. This creates a low voltage at the base of transistor $Q_{33}$, thereby creating a low ECL output state at terminal 303.

As mentioned above, the negative aspects of ECL circuits include high power dissipation and low noise immunity. In order to reduce power dissipation, it is desirable to reduce the power supply to approximately −3.3 V. However, with respect to the single level ECL circuitry, this power supply reduction requires that the input voltage swing (voltage variation between high and low input signals) must be reduced to about 400 mV or less. To operate at this voltage swing, the reference voltage $V_{REF}$ must be very accurately maintained to avoid logic errors due to noise or variations in the $V_{REF}$ signal. That is, if $V_{REF}$ drifts above the logic high voltage level or below the logic low voltage level, then the ECL circuit will malfunction. Therefore, to employ a −3.3 V voltage source in prior art single level ECL circuits, the ECL circuits must be limited to small die with minimum bus drops. Further, with respect to single-ended-input, multi-level ECL circuitry, bias considerations require an absolute minimum power supply of −4.2 V for a saturation free circuit operation. These restrictions prevent the production of high gate count ECL/BiCMOS arrays exhibiting low power consumption.

SUMMARY OF THE INVENTION

The present invention is directed to a circuit that satisfies the need for a ECL/BiCMOS ECL circuit which operates on a power supply of −3.3 V, and therefore exhibits lower power dissipation and improved noise immunity in comparison with prior art ECL circuits. The present ECL circuit uses differential input signals (instead of reference signals) to switch the emitter-coupled transistor pairs of the ECL circuit between high and low output states, thereby substantially reducing the input voltage swing and facilitating the −3.3 V power supply.

An ECL basic cell in accordance with the present includes first and second transistors having emitters connected to a common node. The first transistor has a first collector connected to a first output terminal and a first base connected to receive a first biasing signal. The second transistor has a second collector connected to a second output terminal and a second base connected to receive a second biasing signal. The first and second biasing signals driving the first and second transistors are logical complements, thereby obviating the need for a reference voltage.

An ECL OR/NOR circuit in accordance with the present invention includes two or more differential transistor pairs, each transistor pair having a first transistor receiving a non-inverted input signal and a second transistor receiving an inverted (complementary) input signal. The first transistors of all of the transistor pairs are connected to a first output terminal, and the second transistors of all of the transistor pairs are connected to a second output terminal. When one or more of the first transistors receives a high non-inverted signal, the ECL OR/NOR circuit produces a high OR output on the first output terminal and a low NOR output on the second output terminal. Conversely, when all of the first transistors receive a low non-inverted signal, the ECL OR/NOR circuit produces a low OR output signal on the first output terminal and a high NOR output on the second output terminal.

BRIEF DESCRIPTION OF THE DRAWINGS

These and other features, aspects, and advantages of the present invention will become better understood with regard to the following description, appended claims, and accompanying drawings, where:

DESCRIPTION OF THE PREFERRED EMBODIMENT

The present invention is disclosed in examples including an ECL basic cell and a multiple input ECL OR/NOR gate. These circuits are provided as an examples, and it is understood that the invention is not limited to the specifically disclosed circuit structures.

ECL Basic Cell

Figure 1:
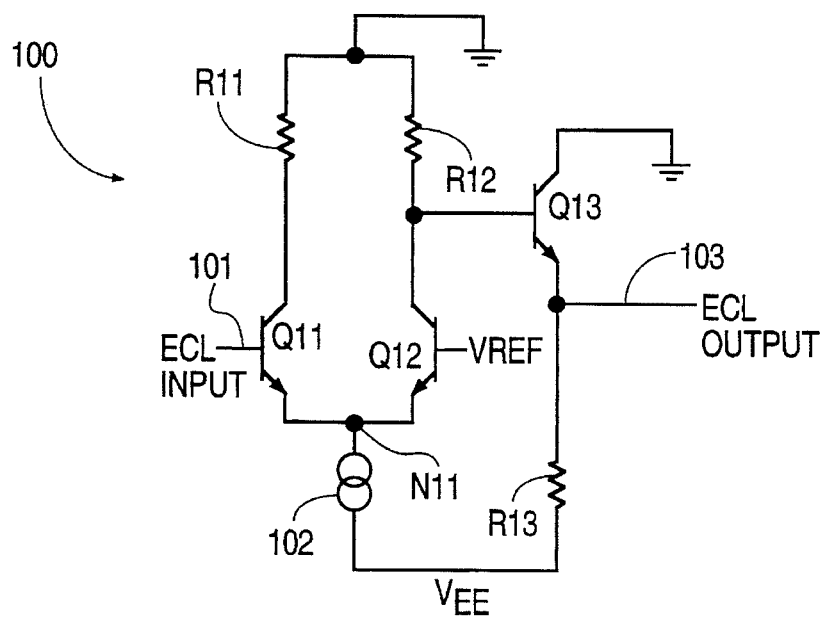
FIG. 1 is a schematic diagram of a prior art single level ECL switch.
Figure 2:
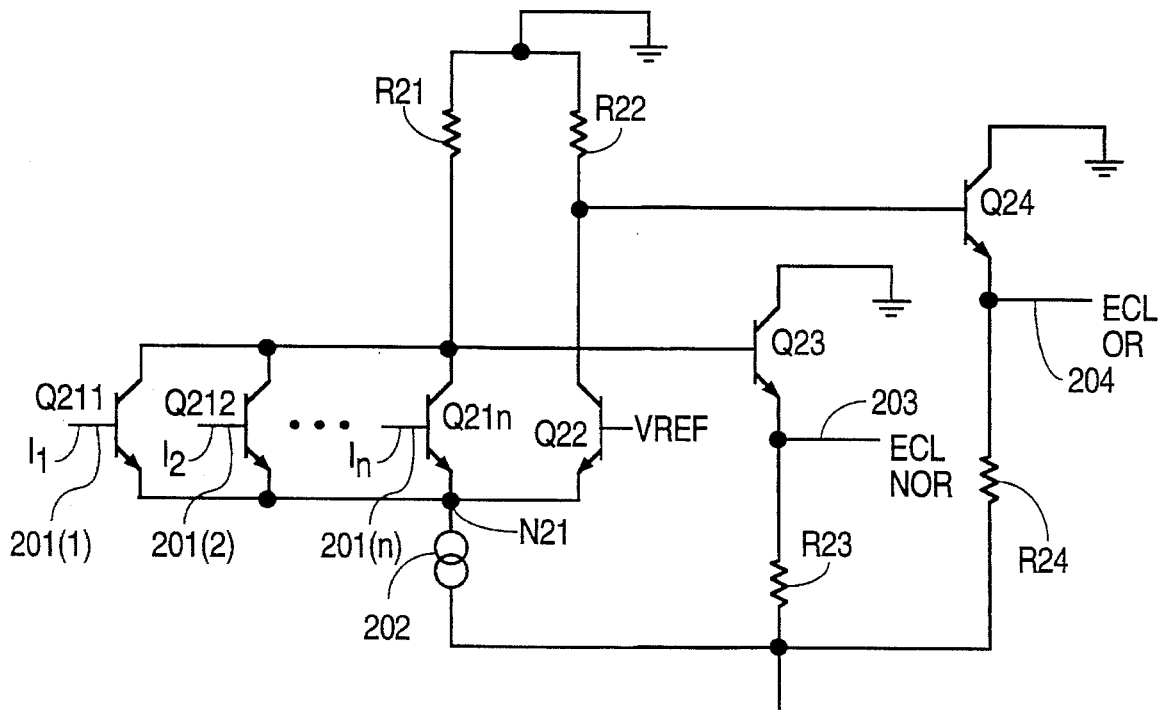
FIG. 2 is a schematic diagram of a prior art single level, multiple input ECL OR/NOR gate.
Figure 3:
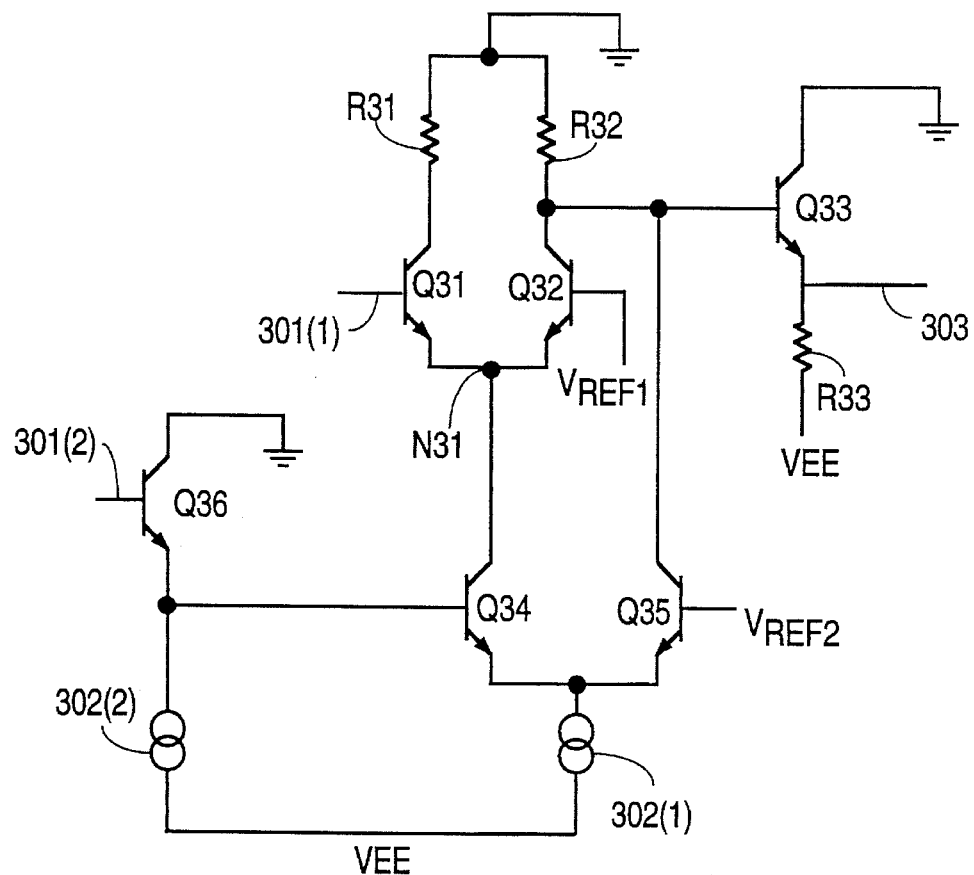
FIG. 3 is a schematic diagram of a prior art multilevel ECL AND gate.
Figure 4:
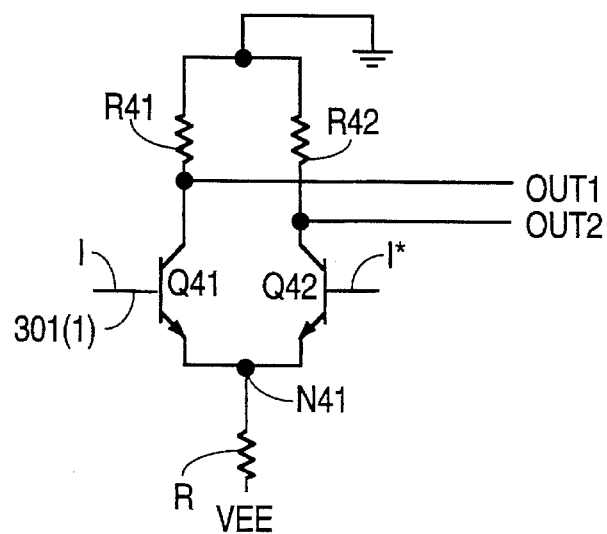
FIG. 4 is a schematic diagram of an ECL basic cell according to the present invention.

FIG. 4 shows a simplified ECL cell 400 in accordance with the present invention. ECL cell 400 includes a differential transistor pair including transistors $Q_{41}$ and $Q_{42}$ having emitters commonly connected at a node $N_{41}$ which is connected to $V_{EE}$ through a resistor R or through an active current source (not shown). Transistors $Q_{41}$ and $Q_{42}$ have collectors connected to ground (first voltage potential) through resistors $R_{41}$ and $R_{42}$, respectively. The collector of transistor $Q_{41}$ is connected to an output terminal OUT1 and the collector of transistor $Q_{42}$ is connected to an output terminal OUT2 (of course, one of the output terminals OUT1 and OUT2 may be omitted). An input signal I is applied to the base of transistor $Q_{41}$, and an inverted (complementary) input terminal I* is applied to the base of transistor $Q_{42}$ (The symbol "*" is used throughout to denote a complementary signal). Note that $V_{EE}$ is maintained at a level below ground, and is preferably −3.3±0.3 V. Further, input signals I and I* preferably vary by 300 mV; for example, when input signal I is high (i.e., 0 V), complementary input signal I* is low (i.e., −0.30 V); conversely, when input signal I is low (i.e., −0.30 V), complementary input signal I* is high (i.e., 0 V).

In operation, a high input signal I turns on transistor $Q_{41}$ and corresponding low complementary input signal I* turns off transistor $Q_{42}$. With $Q_{41}$ turned on, current flows from through resistor $_{41}$, resulting in a voltage drop across resistor $_{41}$ applies a low output voltage of approximately 0.30 V on output terminal OUT1. At the same time, with transistor $Q_{42}$ turned off, almost no current passes through resistor $R_{42}$, thereby raising the voltage on output terminal OUT2 approximately to ground (i.e., high).

Conversely, when a low input signal I is applied to input terminal 401, transistor $Q_{41}$ is turned off and, in response to high complementary input signal I*, transistor $Q_{42}$ is turned on. With transistor $Q_{41}$ turned off and transistor $Q_{42}$ turned on, output terminal OUT1 is high, and output terminal OUT2 is low.

By using applying complementary signals I and I* to drive the transistors $Q_{41}$ and $Q_{42}$, ECL cell 400 avoids the necessity of using a reference voltage. As such, the input voltage swing are reduced from 600 mV in the prior art to approximately 300 mV, thereby allowing a reduction of $V_{EE}$ to $-3.3\pm0.3$ V. In addition, because of the reduced output swing and the use of differential input signals, ECL circuits prepared in accordance with the present invention have an advantage over prior art ECL circuits in terms of improved operating speed and improved noise immunity. Further, because reference voltages are not used, ECL circuits prepared in accordance with the present invention are not restricted to small die sizes due to reference voltage variations.

Multiple Input ECL OR/NOR Gate

Figure 5:
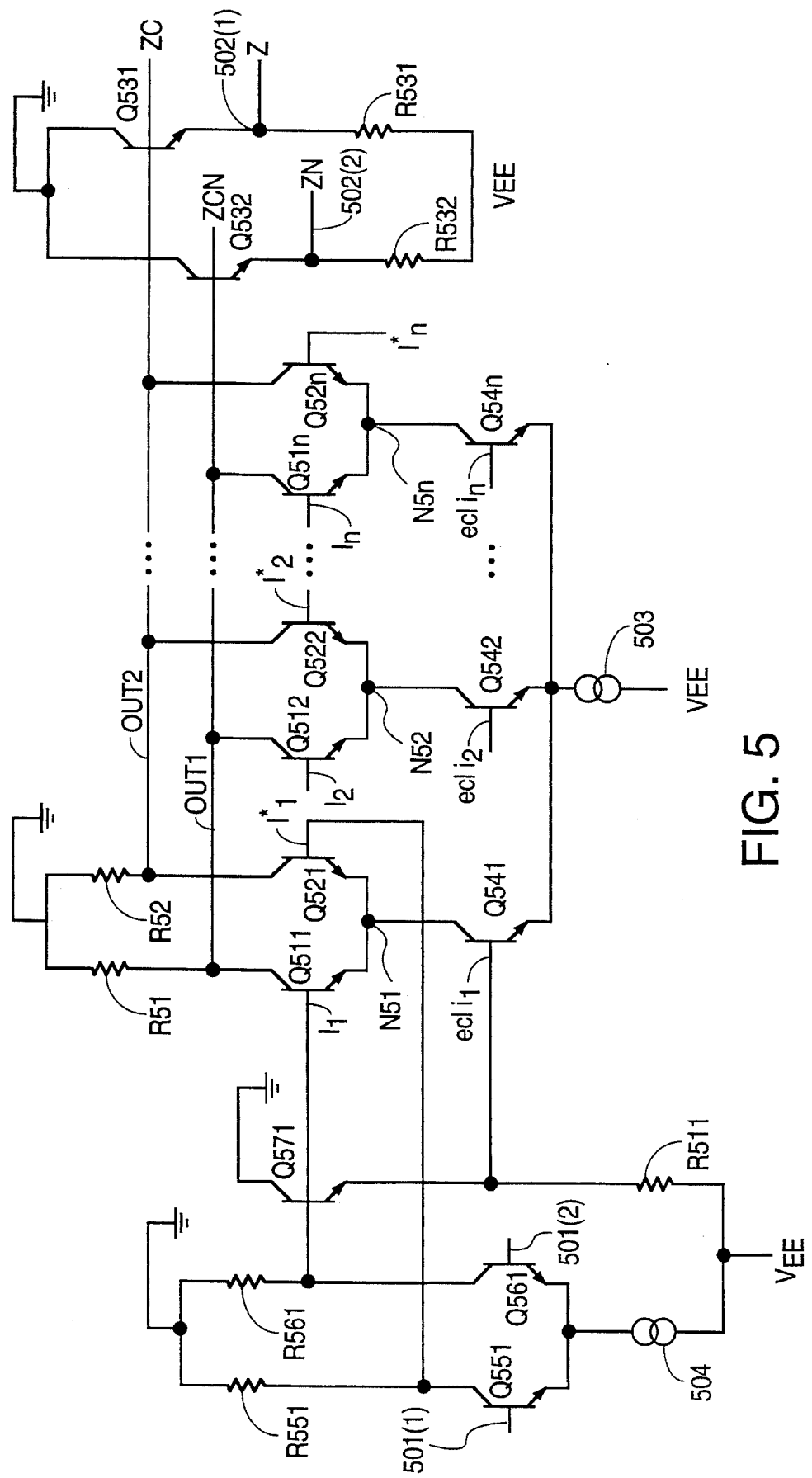
FIG. 5 is a schematic diagram of an n-input multiple differential ECL OR/NOR gate according to the present invention.

FIG. 5 shows a multiple input ECL OR/NOR gate 500 in accordance with the present invention. ECL OR/NOR gate 500 includes a plurality of differential transistor pairs ($Q_{511}/Q_{521}$, $Q_{512}/Q_{522}$ ... $Q_{51n}/Q_{52n}$), each differential pair being connected to an associated node $N_{51}$, $N_{52}$ ... $N_{5n}$. That is, the emitters of transistor pair $Q_{511}/Q_{521}$ are connected to node $N_{51}$, the emitters of transistor pair $Q_{522}/Q_{522}$ are connected to node $N_{5n}$, and the emitters of transistor pair $Q_{52n}/Q_{52n}$ are connected to node $N_{5n}$. First transistors $Q_{511}$, $Q_{512}$ ... $Q_{51n}$ of each transistor pair are connected to receive a noninverted input signal $I_1, I_2 \ldots I_n$, and the collector of each of the first transistors is connected to a first output terminal OUT1 and to ground through a first resistor $R_{51}$. Similarly, second transistors $Q_{521}, Q_{522} \ldots Q_{52n}$ of each transistor pair are connected to receive an inverted (complementary) input signal $I_1^*, I_2^* \ldots I_n^*$, and the collector of each of the second transistors is connected to a second output terminal OUT2 and to ground through a second resistor $R_{52}$. Finally, each node $N_{51}, N_{52} \ldots N_{5n}$ is connected to $V_{EE}$ through transistors $Q_{541}, Q_{542} \ldots Q_{54n}$, respectively, and through a constant current source 503. That is, transistor $Q_{541}$ has a collector collected to node $N_{51}$ and an emitter connected to current source 503, transistor $Q_{542}$ has a collector collected to node $N_{52}$ and an emitter connected to current source 503, and transistor $Q_{54n}$ has a collector collected to node $N_{5n}$ and an emitter connected to current source 503, this current source 503 being connected to $V_{EE}$. Although only three differential transistor pairs are shown, it is understood that any number of transistor pairs may be included in the ECL OR/NOR gate 500.

Each differential transistor pair $Q_{511}/Q_{521}$, $Q_{512}/Q_{523}$ ... $Q_{51n}/Q_{52n}$ receives input signals $I_1/I_1^*, I_2/I_2^* \ldots I_n/I_n^*$ from an associated driving circuit. It is noted that only one of the driving circuits associated with a first differential transistor pair $Q_{511}$ and $Q_{521}$ is shown, the driving circuits associated with the other differential transistor pairs being omitted for clarity. The illustrated driving circuit includes transistors $Q_{55}$ and $Q_{56}$ having collectors connected to ground through resistors $R_{55}$ and $R_{56}$, and emitters connected to $V_{EE}$ through a current source 504. The bases of transistors $Q_{55}$ and $Q_{56}$ are connected to first input terminal 501(1) and second input terminal 501(2). The input signals applied to the input terminals 501(1) and 501(2) are preferably complementary, but the use of a reference voltage may be desirable where the input terminals 501(1) and 501(2) are incorporated into an input buffer of the ECL circuit. The complementary input signals are applied to the driving circuits have a logic swing of approximately 300 mV, and may be based on either CML (current-mode logic) or ECL voltage levels. The driving circuit also includes a transistor $Q_{57}$ which has a base connected to receive signal $I_1$, a collector connected to ground, and an emitter connected to $V_{EE}$ through a resistor $R_{57}$. In addition, the emitter of transistor $Q_{57}$ is connected to the base of transistor $Q_{541}$ such that transistor $Q_{54}$ is driven by a signal $ecl_{i1}$ whose voltage level is one diode drop below signal $I_1$.

The ECL OR/NOR gate 500 also includes an output circuit connected to output terminals OUT1 and OUT2. The output circuit includes transistor $Q_{531}$, which has a base connected to output terminal OUT2, and transistor $Q_{532}$, which has a base connected to output terminal OUT1. Both transistors $Q_{531}$ and $Q_{532}$ have collectors connected to ground, and have emitters connected to $V_{EE}$ through resistors $R_{531}$ and $R_{532}$, respectively. The emitters of transistors $Q_{531}$ and $Q_{532}$ form ECL OR output Z and ECL NOR output $Z_N$, respectively. It is also noted that CML outputs $Z_C$ and $Z_{CN}$ may be taken directly from output terminals OUT2 and OUT1, respectively.

In operation, when the drive circuit associated with any of the differential transistor pairs $Q_{511}/Q_{521}$, $Q_{512}/Q_{522}$ ... $Q_{51n}/Q_{52n}$ receives a high signal on input terminal 501(1) and a low signal on input terminal 501(2), transistor $Q_{55}$ is turned on and transistor $Q_{56}$ is turned off. With transistor $Q_{55}$ turned on and transistor $Q_{56}$ off, the associated signal $I_1, I_2 \ldots I_n$ is at a CML high voltage level (approximately ground) and the associated signal $I_1^*, I_2^* \ldots I_n$ is at a CML low voltage level (approximately $-0.30$ volts). As such, the associated transistor $Q_{511}, Q_{512} \ldots Q_{51n}$ is turned on and the associated transistor $Q_{521}, Q_{522} \ldots Q_{52n}$ is turned off. In addition, the high signal $I_1, I_2 \ldots I_n$ turns on the associated transistor $Q_{57}$, which in turn applies a high signal $ecl_{i1}, ecl_{i2} \ldots ecl_{in}$ to the associated transistor $Q_{541}, Q_{542} \ldots Q_{54n}$, turning this transistor on. In this state, current passes through resistor $R_{51}$, thereby applying a low voltage on output terminal OUT1, which creates a low ECL output state at ECL NOR output $Z_N$. In addition, with transistors $Q_{521}, Q_{522} \ldots Q_{52n}$ turned off, little or no current passes through resistor $R_{52}$, thereby raising output terminal OUT2 to a CML high level (approximately ground), thereby providing a high ECL output state at ECL OR output Z.

Conversely, when all of the drive circuits associated with the differential transistor pairs $Q_{511}/Q_{521}$, $Q_{521}/Q_{522}$ ... $Q_{51n}/Q_{52n}$ receive a low signal on input terminal 501(1) and a high signal on input terminal 501(2), transistors $Q_{55}$ are turned off and transistors $Q_{56}$ are turned on. With transistors $Q_{55}$ turned off and transistors $Q_{56}$ turned on, all of the signals $I_1, I_2 \ldots I_n$ are at a CML low voltage level, and all of the associated signals $I_1^*, I_2^* \ldots I_n^*$ are at a CML high voltage level. As such, all of the transistors $Q_{511}, Q_{512} \ldots Q_{51n}$ are turned off and all of the transistors $Q_{521}, Q_{522} \ldots Q_{52n}$ are turned on. In addition, the low signals $I_1, I_2 \ldots I_n$ maintain all of the associated transistors $Q_{541}, Q_{542} \ldots Q_{54n}$, in a low conductive state. In this state, current passes through resistor $R_{52}$, thereby creating a low ECL OR output Z. In addition, with transistors $Q_{521}, Q_{522} \ldots Q_{52n}$ turned on, little or no current passes through resistor $R_{51}$, thereby raising output terminal OUT1 to a CML high voltage level and creating a high ECL NOR output $Z_N$.

Although the present invention has been described in considerable detail with reference to the multiple input ECL OR/NOR gate 500, other versions are possible. For example, the present invention may be incorporated into multilevel ECL logic gates (such as AND and NAND gates) with the same beneficial effect of reducing $V_{EE}$ and thereby reducing power dissipation. Therefore, the spirit and scope of the appended claims should not be limited to the description of the preferred circuits contained herein.

We claim:

1. An emitter-coupled logic circuit comprising:

first and second transistors having emitters connected to a first node, the first transistor having a first collector and a first base connected to receive a first biasing signal, and the second transistor having a second collector and a second base connected to receive a second biasing signal, wherein the first and second biasing signals are logical compliments, and wherein the first collector is connected to a first voltage potential through a first resistor and the second collector is connected to the first voltage source through a second resistor;

a driving circuit, the driving circuit receiving an input signal and generating the first and second biasing signals in response to the input signal, the driving circuit including:

third and fourth transistors having emitters connected to a second node, the third transistor having a third connector connected to the first base and a third base connected to receive the input signal, the fourth transistor having a fourth collector connected to the second base, wherein the third collector is connected to the first voltage potential through a third resistor and the fourth collector is connected to the first voltage source through a fourth resistor;

a first constant current source connected to the second node such that a sum of currents passing through the third and fourth transistors is constant, wherein the first constant current source is connected to the second voltage potential;

a fifth transistor having a fifth collector connected to the first voltage source, a fifth base connected to the first biasing signal, and a fifth emitter connected to the second voltage potential through a fifth resistor;

a sixth transistor having a sixth collector connected to the first node, a sixth base connected to the fifth emitter, and a sixth emitter; and a second constant current source connected to the sixth emitter.

2. A method for processing digital information comprising the steps of:

connecting emitters of firsthand second transistors to a first node;

applying a first biasing signal to a base of the first transistor;

applying a second biasing signal to a base of the second transistor, wherein the second biasing signal is a logical compliment of the first biasing signal;

connecting the first collector to a first voltage potential through a first resistor;

connecting the second collector to the first voltage source through a second resistor;

applying an input signal to a base of one of a third transistor and a fourth transistor;

connecting a third emitter of the third transistor and a fourth emitter of the fourth transistor to a second node;

connecting a third collector of the third transistor to the first base and a fourth collector of the fourth transistor to the second base;

connecting the second node to a first constant current source such that a sum of currents passing through the third and fourth transistors is constant;

connecting the third collector to the first voltage potential through a third resistor;

connecting the fourth collector to the first voltage source through a fourth resistor;

connecting the first constant current source to the second voltage potential;

connecting a collector of a fifth transistor to the first voltage source;

connecting a fifth base of the fifth transistor to the first biasing signal;

connecting a fifth emitter of the fifth transistor to the second voltage potential through a fifth resistor;

connecting a sixth collector of a sixth transistor to the first node;

connecting a sixth base of the sixth transistor to the fifth emitter;

connecting a second constant current source to the sixth emitter such that a sum of currents passing through the first and second transistors is constant; and connecting the constant current source to a second voltage potential.

3. An emitter-coupled logic circuit comprising:

first and second transistors having emitters connected to a first node, the first transistor having a first collector connected to a first voltage potential through a first resistor and a first base connected to receive a first biasing signal, and the second transistor having a second collector connected to the first voltage potential through a second resistor and a second base connected to receive a second biasing signal, wherein one of the first and second collectors are connected to an output terminal, wherein the first and second biasing signals are logical compliments;

a third transistor having a third collector connected to the first voltage source, a third base connected to the first biasing signal, and a third emitter;

a fourth transistor having a fourth collector connected to the first node, a fourth base connected to the third emitter, and a fourth emitter; and a constant current source connected to the fourth emitter such that when the fourth transistor is biased to conduct, a sum of currents passing through the first and second transistors is constant.

4. An emitter-coupled logic circuit for generating an output signal on an output line which is determined by a logic function of a first input signal and a second input signal, the circuit comprising:

first and second transistors having emitters connected to a first node, the first transistor having a first collector connected to a first voltage potential through a first resistor and a first base connected to receive a first biasing signal, and the second transistor having a second collector connected to the first voltage potential through a second resistor and a second base connected to receive a second biasing signal, wherein the first and second biasing signals are logical compliments, the first and second biasing signals being determined by the first input signal;

a third transistor having a third collector connected to the first node, a third base and a third emitter;

fourth and fifth transistors having emitters connected to a second node, the fourth transistor having a fourth collector connected to the first collector and a fourth base connected to receive a third biasing signal, and the fifth transistor having a fifth collector connected to the second collector and a fifth base connected to receive a fourth biasing signal, wherein the third and fourth biasing signals are logical compliments, the third and fourth biasing signals being determined by the second input signal;

a sixth transistor having a sixth collector connected to the second node, a sixth base and a sixth emitter; and a first constant current source having a first terminal connected to the third and sixth emitters and a second terminal connected to a second voltage potential.

5. An emitter-coupled logic circuit of claim 1 wherein the first voltage potential is ground and the second voltage potential is −3.3±0.3 volts.

6. An emitter-coupled logic circuit of claim 1, wherein a first output terminal is connected to the first collector and a second output terminal is connected to the second collector, and the emitter-coupled circuit further comprising an output circuit connected to the first and second output terminals, the output circuit comprising:

a seventh transistor having a seventh collector connected to the first voltage source, a seventh base connected to the first output terminal and a seventh emitter connected to the second voltage source through a sixth resistor; and an eighth transistor having an eighth collector connected to the first voltage source, an eighth base connected to the second output terminal and an eighth emitter connected to the second voltage source through a seventh resistor.

7. The method of claim 2 wherein the first voltage potential is ground and the second voltage potential is −3.3±0.3 volts.

8. The method of claim 2 further comprising the steps of:

connecting a seventh collector of a seventh transistor to the first voltage source;

connecting a seventh base of the seventh transistor the first collector of the first transistor;

connecting a seventh emitter of the seventh transistor the second voltage source through a sixth resistor;

connecting an eighth collector of an eighth transistor to the first voltage source;

connecting an eighth base of the eight transistor to the second collector of the second transistor; and connecting an eighth emitter of the eighth base to the second voltage source through a seventh resistor.

9. An emitter-coupled logic circuit according to claim 3, wherein the third emitter is connected to a second voltage potential through a third resistor.

10. An emitter-coupled logic circuit of claim 4, further comprising:

a seventh transistor having a seventh collector connected to the first voltage source, a seventh base connected to the first biasing signal, and a seventh emitter connected to the third base.

11. An emitter-coupled logic circuit according to claim 10, wherein the seventh emitter is connected to the second voltage potential through a third resistor.

12. An emitter-coupled logic circuit according to claim 10, further comprising:

eighth and ninth transistors having emitters connected to a third node, the eighth transistor having an eighth collector connected to the first base and an eighth base connected to receive the input signal, and the ninth transistor having a ninth collector connected to the second base, a second constant current source having a first terminal connected to the third node and a second terminal connected to the second voltage potential such that a sum of currents passing through the eighth and ninth transistors is constant, wherein the eighth collector is connected to the first voltage potential through a fourth resistor and the ninth collector is connected to the first voltage potential through a fifth resistor.

* * * * *

UNITED STATES PATENT AND TRADEMARK OFFICE
CERTIFICATE OF CORRECTION

PATENT NO.    :   5,463,332
DATED         :   October 31, 1995
INVENTOR(S)   :   Loren W. Yee and Nguyen X. Sinh It is certified that error appears in the above-identified patent and that said Letters Patent is hereby corrected as shown below:

Column 1, line 67, after "is" insert --connected--;

Column 3, line 41, after "present" insert --invention--;

Column 5, line 48, delete "Q523" and insert --Q522--;

Column 6, line 41, delete "Q521/Q522" and insert
    --Q512/Q522--;

Column 7, line 19, delete "connector" and insert
    --collector--;

Column 7, line 41, delete "firsthand" and insert --first
    and--.

Signed and Sealed this

Twenty-fifth Day of June, 1996

*Attest:*

BRUCE LEHMAN

*Attesting Officer*     *Commissioner of Patents and Trademarks*